United States Patent
Baltes

(10) Patent No.: US 6,710,322 B1
(45) Date of Patent: Mar. 23, 2004

(54) DEVICE FOR DETECTING THE POSITION OF A SELECTOR LEVER

(75) Inventor: Andreas Baltes, Sulzbach (DE)

(73) Assignee: Mannesmann VDO AG, Frankfurt (DE)

( * ) Notice: Subject to any disclaimer, the term of this patent is extended or adjusted under 35 U.S.C. 154(b) by 259 days.

(21) Appl. No.: 09/707,713

(22) Filed: Nov. 7, 2000

(30) Foreign Application Priority Data

Nov. 10, 1999 (DE) .......................................... 199 54 173
Dec. 15, 1999 (DE) .......................................... 199 60 446

(51) Int. Cl.⁷ ............................. H01J 40/14; H01J 1/56
(52) U.S. Cl. ............................. 250/214 PR; 250/229; 250/231.1; 33/DIG. 3; 33/DIG. 15
(58) Field of Search ................. 250/221, 222.1, 250/214 PR, 229, 231.1; 273/148 R, 150; 33/DIG. 3, DIG. 15

(56) References Cited

U.S. PATENT DOCUMENTS

| | | | | |
|---|---|---|---|---|
| 3,598,933 A | * | 8/1971 | Walser ........................ | 250/221 |
| 4,223,217 A | * | 9/1980 | Bongard et al. ............. | 250/229 |
| 4,523,373 A | | 6/1985 | Walker, Jr. et al. | |
| 4,572,948 A | * | 2/1986 | Brooks ........................ | 250/221 |
| 5,132,531 A | * | 7/1992 | Duncan et al. ............. | 250/229 |
| 5,523,561 A | * | 6/1996 | Ironside et al. ........... | 250/231.1 |
| 5,962,841 A | * | 10/1999 | Okumura et al. ............ | 250/229 |

FOREIGN PATENT DOCUMENTS

| | | |
|---|---|---|
| DE | 2424376 | 12/1974 |
| DE | 2357496 | 5/1975 |
| DE | 8902383 | 6/1989 |
| DE | 4302670 | 8/1994 |
| DE | 19607421 | 9/1997 |

* cited by examiner

Primary Examiner—Stephone B. Allen
(74) Attorney, Agent, or Firm—Martin A. Farber

(57) ABSTRACT

A invention relates to a device for detecting the position of a selector lever, in which the selector lever is connected to a switching device that transmits a signal to an evaluation device for a desired position of the selector lever. In a a device for detecting the position of a selector lever which operates reliably over its entire service life and can be produced at reasonable cost, the selector lever (1) is connected to a diaphragm (2, 3) arranged in the beam path between an optical transmitter (18) and an optical receiver (9, 10, 11, 12, 13, 14), the diaphragm (2, 3), which follows the movement of the selector lever (1), being designed in such a way as to be optically transparent in the desired position of the selector lever (1), as a result of which the optical receiver (9, 10, 11, 12, 13, 14) receives the signal from the optical transmitter (18) and transmits it to the evaluation device (15).

11 Claims, 4 Drawing Sheets

DEVICE FOR DETECTING THE POSITION OF A SELECTOR LEVER

FIELD AND BACKGROUND OF THE INVENTION

The invention relates to a device for detecting the position of a selector lever, in which the selector lever is connected to a device that emits a signal to an evaluation device in a desired position of the selector lever.

In many areas of application, there are selector levers that can be moved backward and forward in one direction, latcahed in or can be fixed in predetermined positions and control the operation of a connected unit as the operating elements. It is desirable to detect the position of the selector lever in order to be able to control more effectively a system in which the unit controlled by the selector lever is incorporated. In a motor vehicle, information as to which transmission stage has been chosen is necessary for automatic speed control, for example.

According to U.S. Pat. No. 4,523,373, an actuating lever with a potentiometer is known, it being possible at all times to pick off from the potentiometer a voltage corresponding to the position of the selector lever. The potentiometer is installed in a housing in such a way that the same signal voltage is always emitted in a preselected position of the lever. Such contact-controlled position detection systems are subject to wear due to abrasion and dirt accumulation, resulting in variation of the signal voltage corresponding to a particular position of the selector lever over the service life of the potentiometer. There is no longer an unambiguous association between the voltage and the position of the selector layer.

SUMMARY OF THE INVENTION

The object on which the invention is based is to provide a device for detecting the position of a selector lever that operates reliably over its entire service life and can be produced at reasonable cost.

According to the invention, the selector lever is connected to a diaphragm arranged in the beam path between an optical transmitter and an optical receiver, the diaphragm, which follows the movements of the selector lever, being optically transparent in the desired position of the selector lever, as a result of which the optical receiver receives the signal from the optical transmitter and transmits it to the evaluation device.

The advantage of the invention resides in the fact that position detection is contactless. The switching device of the selector lever thus operates completely without wear. It is simple in construction and sufficiently robust for use in a motor vehicle.

Unambiguous detection of the position of the selector lever is ensured by the fact that there is an optical receiver for each position of the selector lever to be determined and that an opening in the diaphragm is moved over the optical receivers as the selector lever is moved.

For an embodiment that is particularly robust for use in motor vehicles, the optical receivers are arranged in a fixed manner on a carrier element in accordance with the sequence of motion of the selector lever.

A particularly compact and small switching device is achieved by arranging the evaluation device connected to the optical receivers on the same carrier element.

In a refinement, at least one optical transmitter is arranged on the carrier element, the optical signal of which can be deviated onto the diaphragm by means of a light guide. Such a device can be used in a flexible manner at any desired point of installation.

To enable the movement of the selector lever in different directions of motion to be detected unambiguously, one diaphragm is provided for each direction of motion of the selector lever. Here, the diaphragms can be moved in mechanical isolation from one another. By virtue of this arrangement, all positions, both in the horizontal and/or vertical direction of motion of the selector lever, are reliably detected.

The second diaphragm, which follows the selector lever in an approximately vertical direction, advantageously has two optically transparent openings, the approximately vertical movement of the selector lever being converted into a circular-arc-like movement of the diaphragm.

To ensure uniform distribution of the optical signal over the diaphragms, the light guide is provided to cover an extended area.

BRIEF DESCRIPTION OF THE DRAWINGS

The invention admits of numerous embodiments. One of these will be explained in greater detail with reference to the figures illustrated in the drawings, in which.

Identical features are indicated by identical reference numerals.

DETAILED DESCRIPTION OF THE PREFERRED EMBODIMENT

Figure 1:
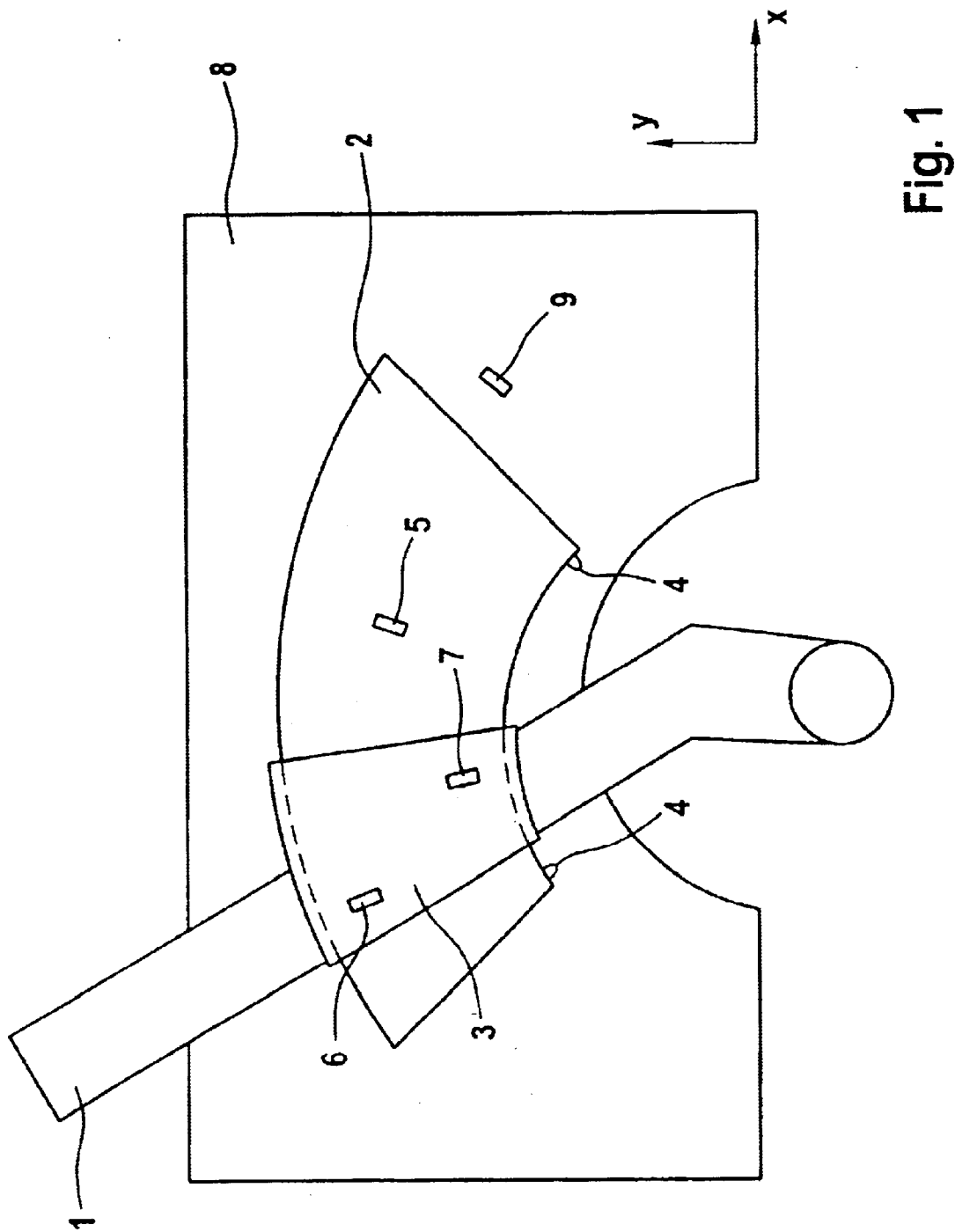
FIG. 1 shows a device according to the invention.

FIG. 1 slows schematically the solution according to the invention for detecting the position of a selector lever such as that which can be used in an automatic transmission for a motor vehicle. The selector lever can latch in in various positions, thereby defining different transmission stages, namely park, reverse, neutral and 3 forward speeds.

In this arrangement, the selector lever 1 is connected to a first diaphragm 2 and a second diaphragm by a mechanism (not shown specifically). The first diaphragm 2 follows the selector lever 1 when the latter is moved approximately in a linear direction (x-direction). If the selector lever 1 is moved perpendicular to the x-direction, diaphragm 2 is held in its position by blocking elements 4, and only diaphragm 3 follows the movement of the selector lever 1.

Diaphragm 2 has an opening 5, while diaphragm 3 bears two openings 6 and 7 offset vertically relative to one another. Optical receivers, of which only one optical receiver 9 is shown, are arranged on a circuit board 8.

Figure 2:
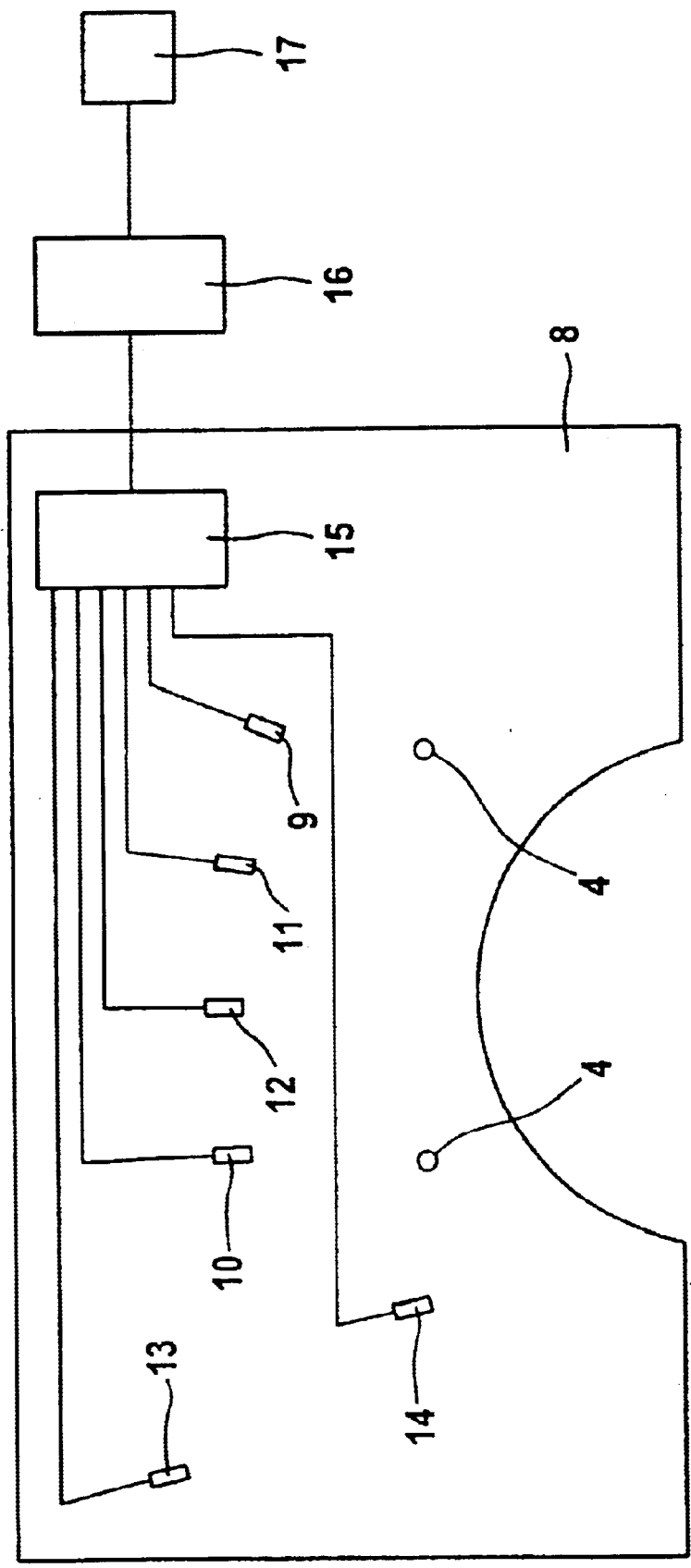
FIG. 2 shows the arrangement of the optical receivers on a circuit board and FIG. 3 shows the arrangement of the optical elements of the device shown in FIG. 1.

The arrangement of all the infrared receivers on the circuit board 8 is shown in FIG. 2. Four infrared receivers 9, 10, 11, 12 serve as a detector for the movement of the selector lever 1 in the x-direction. They are positioned in such a way on the circuit board that, during the movement of diaphragm 2 by the selector lever 1, they are traversed completely one after the other by the opening 5 in this diaphragm 2.

Also arranged on the circuit board 8, vertically, are the infrared diodes 13, 14 that detect the movement of the selector lever 1 in the vertical direction (y-direction) and are associated with the openings 6 and 7 in diaphragm 3.

All the infrared diodes 9 to 14 are connected to an evaluation circuit 15, which is likewise arranged on the circuit board 8. The receiver diodes 9 to 14 convert the optical signal emitted by an optical transmitter 18 (FIG. 3) into an electrical signal, which is evaluated by the evaluation unit 15. A transmission control device 16, which is connected electrically to the evaluation device 15, controls a transmission 17 as a function of the signal supplied by the evaluation device 15.

Figure 3:
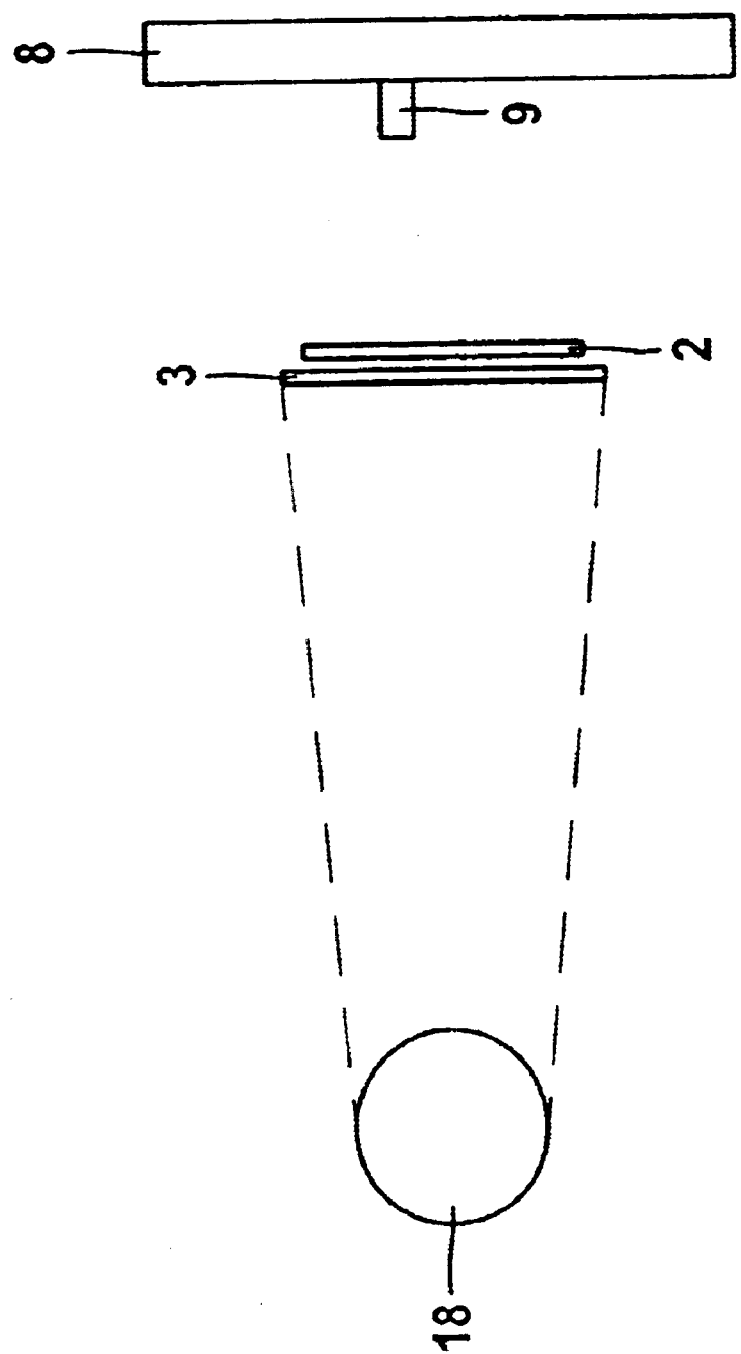

The optical elements of the switching device are shown again schematically in FIG. 3. A light source 19, likewise an infrared diode for example, which, for the sake of simplicity, is also arranged on the circuit board 8, illuminates the surface of the diaphragms 2 and 3. As already explained, the receivers 9, 10, 11, 12, 13, 14 are arranged on the circuit board 8, behind the diaphragms 2, 3, only receiver 9 being indicated in this illustration.

Figure 4:
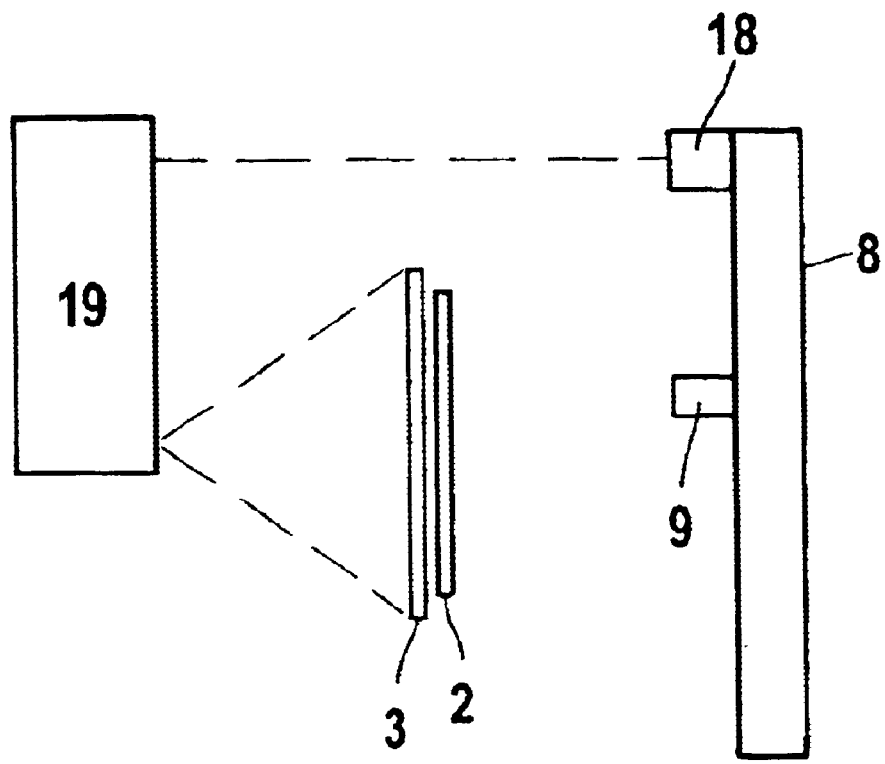
FIG. 4 shows the arrangement of the optical transmitter on the circuit board and deviating light onto the diaphragm by a light guide.

FIG. 4 shows the carrier element 8 having the optical transmitter 18 arranged thereon. Also shown arranged on the carrier element 8 is the receiver diode 9 for converting the optical signal emitted from the optical transmitter 18 into an electrical signal. A light guide 19 is provided for deviating light from the optical transmitter onto the diaphragms 2,3. The light guide 19 further ensures uniform distribution of the optical signal over the diaphragms 2,3 and is provided to cover an extended area as is shown by the dashed lines extending from the light guide 19 to the diaphragms 2,3.

The device according to the invention operates as follows:

Since the selector lever 1 is connected mechanically to diaphragm 2, diaphragm 2 follows the movement of the selector lever 1 when the forward gears or neutral are selected. During this process, the opening 5 in diaphragm 2 is moved over the LEDs 9, 10, 11, 12. Here, the receiver diodes 9, 10, 11, 12 are positioned in such a way on the circuit board 8 that their positions each correspond to one latched position of the selector lever 1. If the opening 5 in diaphragm 2 exposes one of the receiver diodes 9, 10, 11, 12, an unambiguous signal combination is transmitted to the evaluation device 15. This allows the evaluation device 15 to ascertain the position of the selector lever 1. During the movement of diaphragm 2, diaphragm 3 remains in its preselected position, which is chosen so that the opening 5 in diaphragm 2 is not affected by diaphragm 3.

Only when the opening 5 in diaphragm 2 fully exposes the optical receiver for the predetermined position of the selector lever 1 is the position of the selector lever 1 assessed. Such an assessment can be performed in a simple manner in the electronic evaluation device 15 by ascertaining the light output supplied by the receiver. Reliable evaluation is ensured by threshold analysis of the signal supplied by the receiver.

If, for example, a reverse gear is to be selected, this being accomplished, as is known, by moving the selector lever 1 in the y-direction, stops 4 arranged under diaphragm 2 prevent movement of diaphragm 2 in this direction. In this case, only diaphragm 3 follows the movement of the selector lever 1. Here, diaphragm 3 has the openings 6 and 7 that must be brought into alignment with the receiver diode 13 or 14 on the circuit board 8. An appropriate mechanism is used to convert the vertical movement of the selector lever (1) into an approximately circular-arc-like movement of diaphragm 3, this circular-arc-like movement of diaphragm 3 being opposite to the circular-arc-like movement of diaphragm 2.

The vertical movement of the selector lever 1 brings the opening 7 in diaphragm 3 into alignment with the receiver diode 14, and from this the evaluation device 15 detects the fact that a vertical movement of the selector lever 1 has taken place and that reverse gear is to be selected.

When the selector lever 1 reaches the desired Park position, the opening 6 in diaphragm 3 exposes receiver diode 13, thereby indicating to the evaluation device 15 that the desired position has been reached.

I claim:

1. A device for detecting the position of a selector lever, in which the selector lever is connected to a device that emits a signal to an evaluation device in a desired position of the selector lever, wherein the selector lever (1) is connected to a first diaphragm (2) and to a second diaphragm (3), said first and second diaphragms (2,3) being arranged in a beam path between an optical transmitter (18) and an optical receiver (9, 10, 11, 12, 13, 14), wherein there is a mechanical connection between the selector lever and the first diaphragm providing for movement of the first diaphragm in response to movement of the selector lever along a first coordinate direction, the mechanical connection providing for movement of the second diaphragm upon movement of the selector lever in a second coordinate direction; an individual one of the diaphragm (2, 3), which follows movement of the selector lever (1), being optically transparent in the desired position of the selector lever (1), as a result of which the optical receiver (9, 10, 11, 12, 13, 14) receives the signal from the optical transmitter (18) and transmits it to the evaluation device (15).

2. The device as claimed in claim 1, wherein the diaphragms (2, 3) are movable in mechanical isolation from one another.

3. The device as claimed in claim 2, wherein the second diaphragm (3), follows the selector lever (1) in an approximately vertical direction (y), and has two optically transparent openings (6, 7), vertical movement of the selector lever (1) being converted into a circular-arc-like movement of the diaphragm (3).

4. The device as claimed in claim 1, wherein there is a said optical receiver (9, 10, 11, 12, 13, 14) for each position of the selector lever (1) to be determined, and an opening (5, 6, 7) in an individual one of the diaphragms (2, 3) is moved over the optical receivers (9, 10, 11, 12, 13, 14) when the selector lever (1) is moved.

5. The device as claimed in claim 4, wherein the optical receivers (9, 10, 11, 12, 13, 14) are arranged in a fixed manner on a carrier element (8) in accordance with sequence of motion of the selector lever (1).

6. The device as claimed in claim 5, wherein the evaluation device (15) connected to the optical receivers (9, 10, 11, 12, 13, 14) is arranged on said carrier element (8).

7. The device as claimed in claim 5, wherein said optical transmitter (18) is arranged on the carrier element (8), an optical signal of which is deviatable onto the diaphragms (2, 3) by a light guide.

8. The device as claimed in claim 7, wherein the light guide is provided to cover an extended area to ensure uniform distribution of the optical signal over the first and second diaphragms (2, 3).

9. The device as claimed in claim 7, wherein the diaphragms (2,3) are movable in mechanical isolation from one another, the second of said diaphragms (3) follows the selector lever (1) in an approximately vertical direction (y) and has two optically transparent said openings (6, 7), vertical movement of the selector lever (1) being converted into a circular-arc like movement of the diaphragm (3), and the light guide covers an extended area to ensure uniform distribution of the optical signal over the diaphragms (2, 3).

10. A device for detecting the position of a selector lever, in which the selector lever is connected to a device that emits a signal to an evaluation device in a desired position of the selector lever, wherein the selector lever (1) is connected to first diaphragm (2) and to a second diaphragm (3), said first and second diaphragms (2,3) being arranged in a beam path between an optical transmitter (18) and an optical receiver (9, 10, 11, 12, 13, 14), wherein there is a mechanical connection between the selector lever and the first diaphragm providing for movement of the first diaphragm in response to movement of the selector lever along a first coordinate direction, the mechanical connection providing for movement of the second diaphragm upon movement of the selector lever in a second coordinate direction; an individual one of the diaphragms (2, 3), which follows movement of the selector lever (1), being optically transparent in the desired position of the selector lever (1), as a result of which the optical receiver (9, 10, 11, 12, 13, 14) receives the signal from the optical transmitter (18) and transmits it to the evaluation device (15), wherein there is a said optical receiver (9, 10, 11, 12, 13, 14) for each position of the selector lever (1) to be determined, and an opening (5, 6, 7) in an individual one of the diaphragms (2, 3) is moved over the optical receivers (9, 10, 11, 12, 13, 14) when the selector lever (1) is moved.

11. A device for detecting the position of a selector lever, in which the selector lever is connected to a device that emits a signal to an evaluation device in a desired position of the selector lever, wherein the selector lever (1) is connected to first diaphragm (2) and a second diaphragm (3), said first and second diaphragms (2,3) arranged in the beam path between an optical transmitter (18) and an optical receiver (9, 10, 11, 12, 13, 14), the diaphragm (2, 3), which follows movement of the selector lever (1), being optically transparent in the desired position of the selector lever (1), as a result of which the optical receiver (9, 10, 11, 12, 13, 14) receives the signal from the optical transmitter (18) and transmits it to the evaluation device (15), wherein there is a said optical receiver (9, 10, 11, 12, 13, 14) for each position of the selector lever (1) to be determined, and an opening (5, 6, 7) in an individual one of the diaphragms (2, 3) is moved over the optical receivers (9, 10, 11, 12, 13, 14) when the selector lever (1) is moved, wherein the optical receivers (9, 10, 11, 12, 13, 14) are arranged in a fixed manner on a carrier element (8) in accordance with sequence of motion of the selector lever (1), and wherein there is one said diaphragm (2, 3) for each direction of motion of the selector lever (1), the diaphragms (2, 3) are movable in mechanical isolation from one another, the second of said diaphragms (3) follows the selector lever (1) in an approximately vertical direction (y) and has two optically transparent said openings (6, 7), vertical movement of the selector lever (1) being converted into a circular-arc like movement of the diaphragm (3), and a light guide is provided to cover an extended area to ensure uniform distribution of the optical signal over the diaphragms (2, 3).

\* \* \* \* \*